United States Patent [19]

Jackson et al.

[11] Patent Number: 5,544,202
[45] Date of Patent: Aug. 6, 1996

[54] SYNCHRONIZATION APPARATUS

[75] Inventors: Frederick S. Jackson, Glasgow, Ireland; Michael D. Henry, Southampton; David Leaver, Hassocks; Neil Wright-Boulton, Havant, all of England

[73] Assignee: International Business Machines Corporation, Armonk, N.Y.

[21] Appl. No.: 259,592

[22] Filed: Jun. 14, 1994

[30]    Foreign Application Priority Data

Jun. 15, 1993 [GB]  United Kingdom ............... 9312269

[51] Int. Cl.⁶ ........................................... H03D 3/24
[52] U.S. Cl. ..................... 375/376; 331/34; 331/177 R
[58] Field of Search ............................. 375/120; 331/17, 331/34, 177 R

[56]          References Cited

U.S. PATENT DOCUMENTS

| | | | |
|---|---|---|---|
| 4,890,305 | 11/1989 | Devries | 375/120 |
| 5,254,958 | 10/1993 | Flach et al. | 375/120 |
| 5,257,294 | 10/1993 | Pinto et al. | 375/120 |
| 5,278,874 | 1/1994 | Liu et al. | 375/120 |

*Primary Examiner*—Stephen Chin
*Assistant Examiner*—Huong Luu
*Attorney, Agent, or Firm*—Martin J. McKinley; Craig J. Yudell; Andrew J. Dillon

[57]               ABSTRACT

Synchronization apparatus comprising a phase-locked loop for generating an output signal and for synchronizing the output signal to an input signal, characterized in that the apparatus comprises a controller for iteratively determining whether the output signal is synchronized to the input signal by the phase-locked loop and adjusting the frequency of the output signal to bring the output signal within the capture range of the phase-locked loop if the output signal is not synchronized to the input signal.

8 Claims, 3 Drawing Sheets

SYNCHRONIZATION APPARATUS

BACKGROUND OF THE INVENTION

1. Technical Field

The present invention relates to synchronization apparatus for synchronizing an oscillator output to an input synchronization signal over a wide range of frequencies.

2. Description of the Related Art

Conventional synchronization apparatus typically includes a phase-locked loop for locking the output frequency of an oscillator to that of an independently produced input signal. For example, a raster-scanned cathode ray tube (CRT) display device such as a computer visual display unit or a television receiver includes a phase-locked loop for locking an output line scan signal for scanning lines of video onto the CRT screen to an input line synchronization (sync) signal produced by the video source.

In general, a phase-locked loop of this kind is associated with a "capture range" of frequencies sometimes referred to as a "pull-in range". The capture range specifies the range of frequencies centered on the frequency of the line sync signal within which the line scan signal can be brought into synchronization with the line sync signal. If the frequency of the line scan signal is outside the capture range of the phase-locked loop when the line sync signal is first supplied to the display device, the phase-locked loop cannot synchronize the line scan signal to the line sync signal.

The phase-locked loop is also associated with a "hold range" of frequencies, which is usually slightly wider than the capture range. The hold range specifies the range of frequencies centered on the line sync frequency within which the phase-locked loop can hold the line scan signal locked to the line sync signal following, for example, a step change in the line sync frequency. If the step change in the line sync frequency leaves the line scan signal outside the hold range, the phase-locked loop cannot hold the line scan signal in synchronization with the line sync signal. Thereafter, the phase-locked loop can only recover synchronization if the line scan frequency is brought within the capture range.

Many computer display systems can generate video signals in a number of picture display formats. Each display format is characterized by a different combination of raster line and frame sync frequencies. The variation in line sync frequency between different display formats can be relatively wide, from 32 kHz to 64 kHz for example. This variation is much wider than the capture and hold ranges of the phase-locked loops in the synchronization apparatus of conventional display devices, which are typically no greater than 6 kHz. Therefore, a change in display format in the computer display system may produce a step change in line sync frequency that is too large for the phase-locked loop of conventional synchronization apparatus in a display device to follow, leading to a loss of picture synchronization on the screen of the display device.

SUMMARY OF THE INVENTION

In accordance with the present invention, there is now provided synchronization apparatus comprising a phase-locked loop for generating an output signal and for synchronizing the output signal to an input signal, characterized in that the apparatus comprises a controller for iteratively determining whether the output signal is synchronized to the input signal by the phase-locked loop and adjusting the frequency of the output signal to bring the output signal within the capture range of the phase-locked loop if the output signal is not synchronized to the input signal.

Because the controller iteratively determines whether the output signal is synchronized to the input signal by the phase-locked loop and adjusts the frequency of the output signal to bring the output signal within the capture range of the phase locked loop if the output signal is not synchronized to the input signal, synchronization apparatus of the present invention can maintain the output signal in synchronization with the input signal despite large step changes in the frequency of the input signal extending beyond the limits of the capture range of the phase-locked loop. The present invention is therefore especially useful in display devices for computer systems that can generate video signals corresponding to a number of different display formats.

Preferably, the phase-locked loop comprises a variable frequency oscillator for generating the output signal and for varying the frequency of the output signal as a function of a combination of an error signal and an offset level, a signal generator for generating a feedback signal in response to the output signal, and a phase detector for generating an error signal as a function of the phase difference between the input signal and the feedback signal, the offset level being generated by the controller, the offset level being determined by the controller as a function of the frequency of the input signal. The controller preferably comprises means for sampling the output signal in response to the input signal, and means for adjusting the offset level if at least one of a predetermined plurality of successive samples of the output signal has a value other than a first value.

In a preferred embodiment of the present invention, the controller comprises means for resetting the frequency of the output signal to a minimum value in response to a step change in the frequency of the input signal; and means for thereafter adjusting the offset level to increment the frequency of the output signal if at least one of the successive samples of the output signal has a value other than a first value. In a particularly preferred embodiment of the present invention, the controller comprises means for recording a first value of the offset level upon determining that the output signal is synchronized to the input signal, means for thereafter adjusting the offset signal to further increment the frequency of the output signal, means for thereafter adjusting the offset level to decrement the frequency of the output signal upon determining that the output signal is not synchronized to the input signal, means for recording a second value of the offset level upon detecting that the output signal is again synchronized to the input signal, and means for setting the offset level to a value midway between the first and second values to locate the frequency of the output signal in the center of the capture range of the phase-locked loop.

Because the controller places the frequency of the output signal at the center of the capture range of the phase-locked loop following a step change in the frequency of the input signal, the present invention advantageously minimizes the probability of loss of synchronization though frequency drift whether by thermal drift, component aging or a combination of the two. This allows the phase-locked loop to be implemented using wider tolerance, cheaper components.

The controller may be implemented exclusively in hard-wired circuitry. However, for simplicity, the controller preferably comprises: a processor having a first input connected to receive the input signal and a second input connected to receive the output signal, the processor being configured to sample the output signal upon detection of an edge in the input signal and to adjust a digital value if at least one of the predetermined plurality of successive samples has a value other than the first value; and a digital to analog convertor connected to the oscillator for generating the offset level as a function of the digital value determined by the processor.

In a preferred embodiment of the present invention, the controller comprises a pulse width modulator for generating a pulse width modulated signal as a function of the digital value and a low pass filter for generating the offset level as a function of the pulse width modulated signal. For further simplicity, the pulse width modulator is integral to the processor.

It will be appreciated that the present invention extends to a display device comprising apparatus of the present invention as referred to in the preceding paragraphs, wherein the input signal is a raster scan synchronization pulse signal and the output signal generates an address signal for addressing video data to a display screen.

Viewing another aspect of the present invention, there is now provided, a method for synchronizing an input signal to an output signal, the method comprising: generating an error signal as a function of the phase difference between the input signal and the output signal using the phase detector of a phase-locked loop; varying the frequency of the output signal as a function of the error signal using the variable frequency oscillator of the phase-locked loop; iteratively determining whether the output signal is synchronized to the input signal by the phase-locked loop; and iteratively adjusting the frequency of the output signal if the output signal is not synchronized to the input signal.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
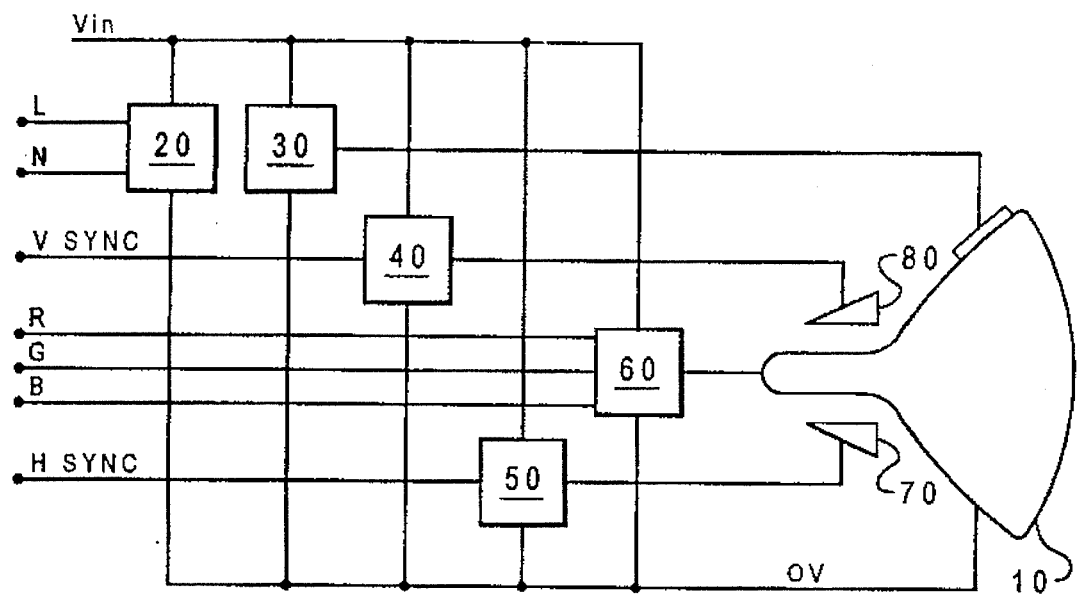
FIG. 1 is a block diagram of a CRT display device.

Referring first to FIG. 1, a CRT display which is capable of operating within a wide range of line and frame scan frequencies comprises a Cathode Ray Tube (CRT) 10 connected to an Extra High Tension voltage (EHT) generator 30 and a video amplifier 60. Line and frame deflection coils, 80 and 70 respectively, are disposed around the neck of the CRT 10. Deflection coils 80 and 70 are connected to line and frame scan circuits, 40 and 50, respectively. A power supply 20 is connected via power supply rails Vin and 0 V to the EHT generator 30, video amplifier 60 and scan circuits 40 and 50.

In operation, EHT generator 30 generates an electric field within CRT 10 for accelerating electrons in beams towards the screen of CRT 10. Line and frame timebase circuits 40 and 50 generate line and frame scan currents in deflection coils 70 and 80. The line and frame scan currents are in the form of ramp signals to produce time-varying magnetic fields that scan the electron beams across CRT screen 10 in a raster pattern. The line and frame scan signals are synchronized by line and frame timebase circuits 50 and 40 to input line and frame sync signals HSYNC and VSYNC generated by, for example, a host computer system (not shown). Video amplifier 60 modulates the electron beams to produce an output display on CRT 10 as a function of input video signals R, G, and B also generated by the host computer system.

Figure 2:
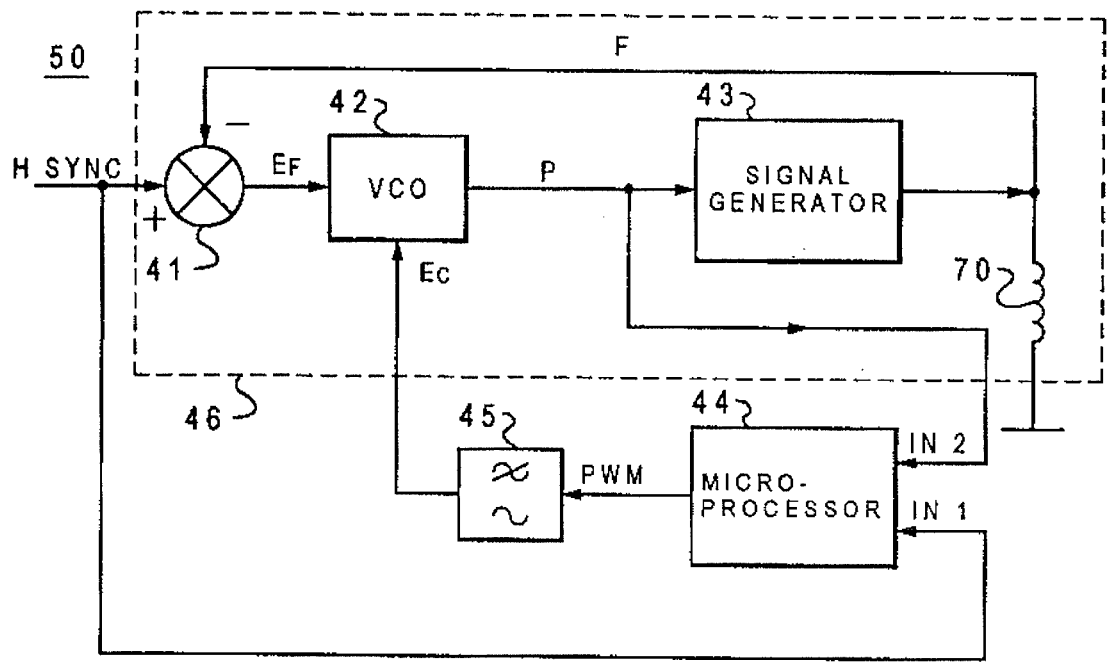
FIG. 2 is block diagram of a line time-base circuit for the CRT display device comprising synchronization apparatus of the present invention.

Referring now to FIG. 2, line timebase circuit 50 comprises synchronization apparatus including a phase-locked loop 46. Phase locked loop 46 includes a voltage controlled oscillator (VCO) 42, a phase detector 41, and a signal generator 43. However, in accordance with the present invention, VCO 42 has both a fine frequency control input and a coarse frequency control input. Phase detector 41 has an error signal output connected to the fine control input of VCO 42. The output of VCO 42 is connected to the input of a ramp signal generator 43. The output of signal generator 43 is connected to the line deflection coils 70. The positive input of phase detector 41 is connected to the line sync signal HSYNC. The negative input of phase detector 41 is connected to the output of signal generator 43 to complete a negative feedback loop. In accordance with the present invention, the output of VCO 42 is also connected to an input IN2 of a microprocessor 44. An interrupt input IN1 to microprocessor 44 is connected to the line sync signal HSYNC. An output PWM of microprocessor 44 is connected to a low-pass filter (LPF) 45. The output of LPF 45 is connected to a coarse control input of VCO 42.

In operation, phase-locked loop 46 of line timebase circuit 50 operates to phase-lock the line scan current in deflection coils 70 to input line sync signal HSYNC. Signal generator 43 generates the line scan current in deflection coils 70. Signal generator 43 also generates a voltage pulse signal or "flyback signal" F corresponding to the line scan current. Flyback signal F is fed back to the negative input of phase detector 41. Phase detector 41 generates an fine error signal Ef in the form of a DC voltage level at the fine frequency control input of VCO 42. The fine error signal Ef is determined by phase detector 41 as a function of the phase difference between line sync signal HSYNC and flyback signal F at the output of signal generator 46. VCO 42 generates a pulse signal P for driving signal generator to produce the line scan current in line deflection coils 70. Pulse signal P thus corresponds to flyback signal F. Microprocessor 44 is configured by computer program code to determine the phase difference between line sync signal HSYNC on IN1 and pulse signal P on IN2 by sampling line sync signal HSYNC and pulse signal P. Output PWM from microprocessor 44 is a pulse-width modulated (PWM) signal. The pulse width of the PWM signal is determined by the phase difference detected by microprocessor 44 between line sync signal HSYNC and pulse signal P. The PWM signal output from microprocessor 44 is integrated by LPF 45 to produce a coarse error signal Ec in the form of a DC voltage level on the coarse frequency control input of VCO 42. The DC voltage level of coarse error signal Ec is determined by the pulse width of the PWM signal at output PWM from microprocessor 44. It will thus be appreciated that, in combination, output PWM from microprocessor 44 and LPF 45 form a digital to analog convertor. The operation of microprocessor 44 will be described in further detail later. The frequency of pulse signal P is determined by the DC voltage levels of the fine and coarse error signals, Ef and Ec, on the fine and coarse control inputs of VCO 42.

The negative feedback loop connecting the output of signal generator 43 to the negative input of phase detector 41 operates to maintain fine error signal Ef at zero thereby phase-locking the line scan current in deflection coils 70 to line sync signal HSYNC. A change in the frequency of line sync signal HSYNC relative to the line scan current in deflection coils 70 produces a phase difference between line sync signal HSYNC and feedback signal F. Fine error signal Ef is given a non-zero value by phase detector 41 in response to the phase difference. The non-zero value of fine error signal Ef produces a change in frequency of pulse signal P at the output of VCO 42 corresponding to the change in frequency of line sync signal HSYNC. The change in frequency of pulse signal P produces a corresponding change in frequency of the line scan current in deflection coils 70 and thus a corresponding change in frequency of flyback signal F. The phase difference between flyback signal F and line sync signal HSYNC thus decreases until fine error signal Ef returns to zero. However, phase detector 41 can only vary fine error signal Ef within a finite range bounded by upper and lower limits.

Figure 3:
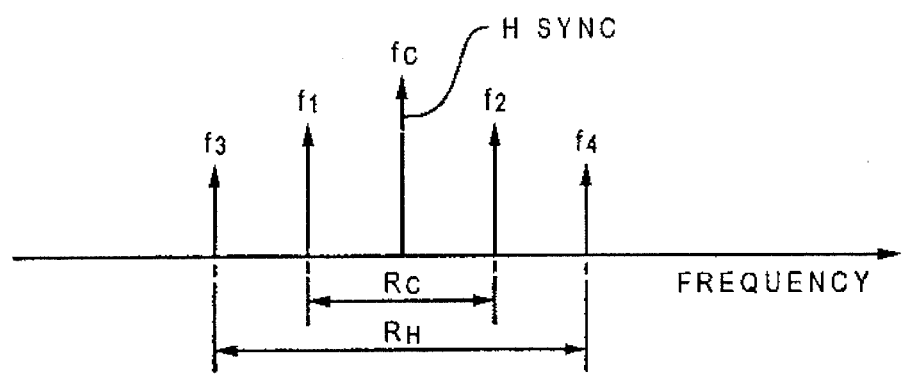
FIG. 3 is a frequency diagram corresponding to the synchronization apparatus.
Figure 4:
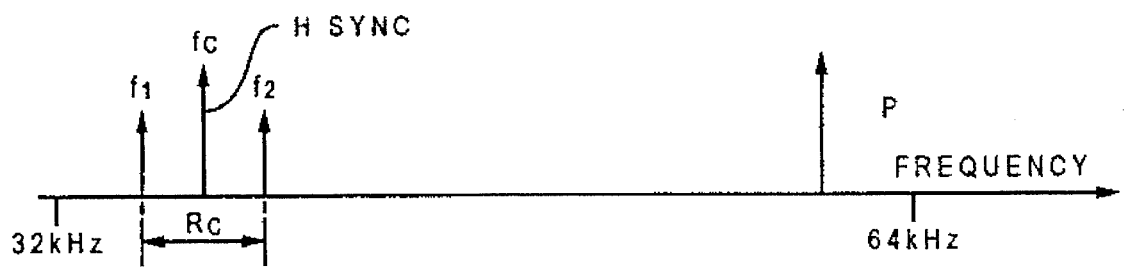
FIG. 4 is another frequency diagram corresponding to the synchronization apparatus.

Referring to FIG. 3, the upper and lower limits of error signal Ef correspond to upper and lower frequency limits f3 and f4 of a hold range Rh of phase detector 41. The hold range Rh is typically a few kHz wide, 6 kHz for example, centered on the frequency fc of line sync signal HSYNC. Phase detector 41 can only keep the line scan current phase-locked to line sync signal HSYNC if the frequency of pulse signal P, and therefore the frequency of flyback signal F, remains within the hold range Rh following a change in the frequency of line sync signal HSYNC. If the change in frequency of line sync signal HSYNC leaves the frequency of pulse signal P outside the hold range Rh, phase detector 41 cannot keep the line scan current phase-locked to line sync signal HSYNC because error signal Ef cannot track the resulting phase difference beyond its upper and lower limits. Synchronization between the line scan current and line sync signal HSYNC is thus lost. Phase detector 41 can only once again phase-lock the line scan current to line sync signal if the frequency of flyback signal F is brought within the upper and lower limits f1 and f2 of a capture range Rc of phase detector 41, also centered on the frequency of line sync signal HSYNC. The capture range Rc is smaller than the hold range Rh, 4 kHz for example. Referring to FIG. 4, following a change in display mode from, for example, a relatively high resolution mode of near 64 kHz line refresh frequency to a relatively low resolution display mode of near 32 kHz line refresh frequency, the frequency of pulse signal P may thus be outside both the capture range Rc and the hold range Rh of phase detector 41. The line scan current can no longer be phase-locked to line sync signal HSYNC by phase detector 41 and picture synchronization to line sync signal HSYNC is lost.

Figure 5:
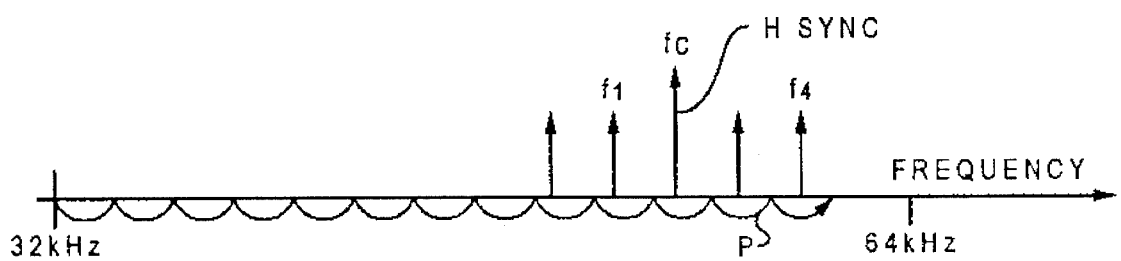
FIG. 5 is a further frequency diagram corresponding to the synchronization apparatus.

Referring now FIG. 5, the aforementioned limitations of the relatively narrow capture and hold ranges Rc and Rh of phase detector 41 are overcome in accordance with the present invention by microprocessor 44 in combination with low pass filter 45 and the coarse control input to VCO 42. In operation, microprocessor 44 operates to frequency-lock the line scan current in deflection coils 70 to line sync signal HSYNC. In response to a step change in the frequency of line sync signal HSYNC, in accordance with, for example, a change in display mode, microprocessor 44 sets the PWM signal at output PWM to minimum pulse width. LPF integrates the PWM signal with minimum pulse width to generate a minimum DC level in coarse error signal Ec on the coarse control input of VCO 42. The minimum DC level on the coarse control input of VCO 42 sets the frequency of pulse signal P to minimum, 32 kHz for example. Microprocessor 44 then samples and compares pulse signal P on input IN2 with line sync signal HSYNC on interrupt input IN1. A description of the sampling and comparison routine of microprocessor 44 will follow shortly. If microprocessor 44 determines that pulse signal P is not locked to line sync signal HSYNC, microprocessor 44 will increment the pulse width of the PWM signal on the input to LPF 45. The increase in the pulse width of the PWM signal produces a corresponding increase in the DC level of coarse error signal Ec and therefore a corresponding increment in the frequency of pulse signal P generated by VCO 42. Microprocessor 44 sample and compares pulse signal P with line sync signal HSYNC again. If microprocessor 44 still determines that pulse signal P is not locked to line sync signal HSYNC, the pulse width of the PWM signal is incremented again and the above described process is repeated. The PWM output of microprocessor 44 has a resolution of 8 bits giving 256 possible pulse widths and therefore 256 possible DC levels in the coarse error signal Ec at the output of LPF 45. The 256 possible DC levels at the coarse control input of VCO 42 provide 256 possible frequencies of pulse signal P from 32 kHz to 64 kHz for example. Microprocessor 44 can therefore increment or decrement the frequency of pulse signal P via microprocessor 44 in 125 Hz steps by incrementing or decrementing the DC level of coarse error signal Ec.

Microprocessor 44 continues to increment the frequency of pulse signal P by increasing the DC level of coarse error signal Ec until it determines that pulse signal P is locked to line sync signal HSYNC, thereby indicating that the last increment in the frequency of pulse signal P brought pulse signal P within the capture range Rc of phase detector 41. The frequency of pulse signal P at the last increment is recorded by microprocessor 44 as the start f1 of the capture range Rc of phase detector 41. Microprocessor 44 then continues to increment the frequency of pulse signal P until it determines that pulse signal P and line sync signal HSYNC are no longer in lock. The frequency of pulse signal P at the last decrement is then recorded by microprocessor as the end f4 of the hold range Rh of phase detector 41.

Figure 6:
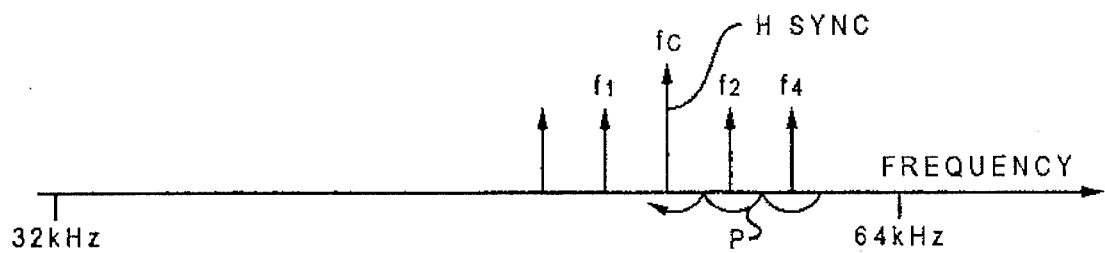
FIG. 6 is yet another frequency diagram corresponding to the synchronization apparatus.

Referring now to FIG. 6, microprocessor 44 then begins to decrement the frequency of pulse signal P by decreasing the coarse error signal Ec until it determines that pulse signal P is locked to line sync signal HSYNC, thereby indicating that the last decrement in the frequency of pulse signal P brought pulse signal P back within the capture range Rc of phase detector 41. The frequency of pulse signal P at the last decrement is recorded by microprocessor 44 as the end f2 of the capture range Rc of phase detector 41. Microprocessor 44 then continues to decrement the frequency of pulse signal P until it determines that pulse signal P and line sync signal HSYNC are no longer in lock. The frequency of pulse signal P at the last decrement is then recorded by microprocessor 44 as the start f3 of the hold range Rh of phase detector 41.

Microprocessor 44 then sets the DC level of coarse error signal Ec to place the frequency of pulse signal P midway between the recorded start and end frequencies, f1 and f2. Thus, in response to a step change in the line refresh frequency, microprocessor 44 adjusts the DC level of coarse of error signal Ec to place the frequency of pulse signal P at or near the center of the capture range Rc of phase detector 41, which, it will be appreciated, is centered on the new frequency of the line sync signal HSYNC. Because, in response to a step change in line refresh frequency, microprocessor 44 places pulse signal P at the center of capture range Rc, the maximum range of fine error signal Ef is always made available to keep pulse signal P locked to line sync signal HSYNC despite thermal drift in phase-locked loop 46.

Figure 7:
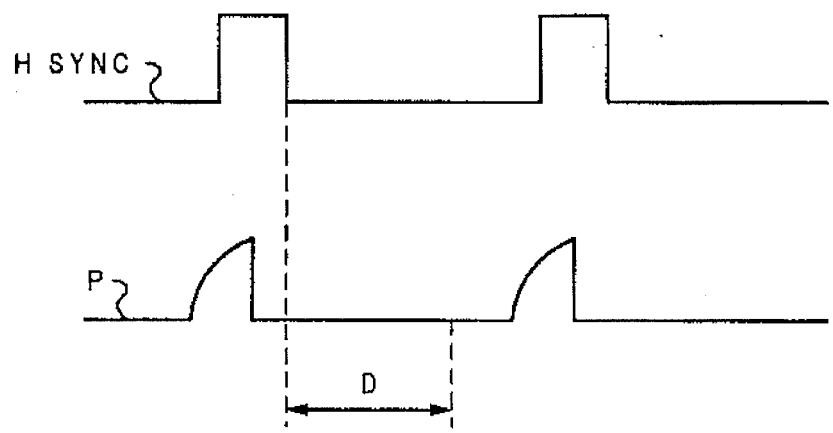
FIG. 7 is a waveform diagram corresponding to the synchronization apparatus.

Referring now to FIG. 7, the trailing edge of each pulse in line sync signal HSYNC triggers an interrupt routine in microprocessor 44 via interrupt input IN1. The interrupt routine configures microprocessor 44 to sample pulse signal P on interrupt input IN2. If in 80 consecutive execution of the interrupt routine, the sample of pulse signal P on IN2 was low, microprocessor 44 determines that pulse signal P is locked to line sync signal HSYNC. Otherwise, microprocessor 44 determines that pulse signal P is not locked to line sync signal HSYNC and continues to increment or decrement the DC level of coarse error signal Ec. The delay D between the trailing edges of line sync signal HSYNC and corresponding sampled points on pulse signal P is the shortest possible time for microprocessor 44 to execute the interrupt routine. D determines the maximum frequency of signals which can be locked. Thus, the maximum frequency of signals to be locked can be increased by increasing the clock frequency of microprocessor 44, thereby reducing D. To lock signals in the range 32 kHz to 64 kHz, a clock frequency providing D of 4 us may be used.

It will now be appreciated that synchronization apparatus of the present invention enables the frequency of the line scan signal in a CRT display device to be quickly changed from one value to another over a wide frequency range in response to a change in input video display format. In conventional CRT displays, the line scan circuit comprises a regulator connected to the signal generator for maintaining a constant amplitude line scan signal, and therefore a constant picture width, between different display formats. One problem associated with such conventional display devices is that step decreases in the line scan signal frequency can cause the regulator to dump too much energy into the signal generator, thereby damaging the signal generator. Conventionally, this problem has been solved by limiting the transient response of the line scan circuit to step changes in line sync frequency. However, this introduces a significant delay before the display stabilizes following a change from one display format to another. In a preferred embodiment of the present invention, this problem is solved by processor 44 switching the regulator off in response to a change in display format. Processor 44 switches the regulator back on again as soon as the line scan frequency has been moved to the new line sync frequency. Because the regulator is switched off while the line scan frequency is being moved, the present invention provides a CRT display device with an extremely fast transient response to changes in display format.

In the embodiment of the present invention hereinbefore described, microprocessor 44 determines that pulse signal P is locked to line sync signal HSYNC on the basis of 80 consecutive samples of pulse signal P. However, it will be appreciated that, in other embodiments of the present invention, the number of samples may be greater than or less than 80 samples. Furthermore, although an embodiment of the present invention has been described hereinbefore in relation to synchronization apparatus in a CRT display device, it will now be appreciated that the present invention is equally applicable to any phase locked loop circuit required to operate over a wide range of frequencies.

While the invention has been particularly shown and described with reference to a preferred embodiment, it will be understood by those skilled in the art that various changes in form and detail may be made therein without departing from the spirit and scope of the invention.

What is claimed is:

1. Synchronization apparatus comprising:

a phase locked loop for synchronizing an output signal (P) to an input signal when the frequency of the input signal is within a predetermined capture range of the output signal, the phase-locked loop comprising a variable frequency oscillator for generating the output signal and for varying the frequency of the output signal as a function of a combination of an error signal and an offset level, a signal generator for generating a feedback signal in response to the output signal, and a phase detector for generating the error signal as a function of a phase difference between the input signal and the feedback signal; and, a controller for iteratively determining whether the output signal is synchronized to the input signal by the phase-locked loop and adjusting the frequency of the output signal to locate the output signal within the capture range of the phase locked loop if the output signal is not synchronized to the input signal, the offset level being generated by the controller as a function of the frequency of the input signal, the controller comprising means for sampling the output signal in response to the input signal and means for adjusting the offset level if at least one of a plurality of successive samples of the output signal has a value other than a first value.

2. Apparatus as claimed in claim 1, wherein the controller comprises means for resetting the frequency of the output signal to a minimum value in response to a step change in the frequency of the input signal; and means for thereafter adjusting the offset level to increment the frequency of the output signal if at least one of the successive samples of the output signal has a value other than the first value.

3. Apparatus as claimed in claim 2, wherein the controller comprises means for recording the first value of the offset level upon determining that the output signal is synchronized to the input signal, means for thereafter adjusting the offset level to further increment the frequency of the output signal, means for thereafter adjusting the offset level to decrement the frequency of the output signal upon determining that the output signal is not synchronized to the input signal, means for recording a second value of the offset level upon detecting that the output signal is again synchronized to the input signal, and means for setting the offset level to a value midway between the first value and the second value to locate the frequency of the output signal in the center of a capture range of the phase-locked loop.

4. Apparatus as claimed in claim 3, wherein the controller comprises: a processor, a first interrupt input connected to receive the input signal, and a second interrupt input connected to receive the output signal, the processor being configured to sample the output signal upon detection of an edge in the input signal and to adjust a digital value if at least one of the predetermined plurality of successive samples has a value other than the first value; and a digital to analog convertor connected to the variable frequency oscillator for generating the offset level as a function of the digital value determined by the processor.

5. Apparatus as claimed in claim 4, wherein the controller comprises a pulse width modulator for generating a pulse width modulated signal as a function of the digital value and a low pass filter for generating the offset level as a function of the pulse width modulated signal.

6. Apparatus as claimed in claim 5, wherein the pulse width modulator is integral to the processor.

7. A display device comprising synchronization apparatus according to claim 1, wherein the input signal is a raster scan synchronization pulse signal and the output signal generates an address signal for addressing video data to a display screen.

8. A method for synchronizing an output signal to an input signal when the frequency of the input signal is within a predetermined capture range of the output signal, the method comprising:

generating an error signal as a function of a phase difference between the input signal and the output signal using a phase detector of a phase-locked loop;

sampling the output signal in response to the input signal;

adjusting an offset level if at least one of a plurality of successive samples of the output signal has a value other than a first value;

varying the frequency of the output signal as a function of the error signal and the offset level using the variable frequency oscillator of the phase-locked loop;

iteratively determining whether the output signal is synchronized to the input signal by the phase-locked loop; and iteratively adjusting the frequency of the output signal if the output signal is not synchronized to the input signal.

* * * * *